US010520829B2

(12) United States Patent
Wang et al.

(10) Patent No.: US 10,520,829 B2
(45) Date of Patent: Dec. 31, 2019

(54) OPTICAL PROXIMITY CORRECTION METHODOLOGY USING UNDERLYING LAYER INFORMATION

(71) Applicant: Taiwan Semiconductor Manufacturing Co., Ltd., Hsinchu (TW)

(72) Inventors: Hung-Chun Wang, Taichung (TW); Chi-Ping Liu, Hsinchu (TW); Cheng Kun Tsai, Hsinchu (TW); Wei-Chen Chien, Hsinchu (TW); Wen-Chun Huang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 214 days.

(21) Appl. No.: 15/715,943

(22) Filed: Sep. 26, 2017

(65) Prior Publication Data

US 2019/0094710 A1   Mar. 28, 2019

(51) Int. Cl.
*G06F 17/50* (2006.01)
*G03F 7/20* (2006.01)

(52) U.S. Cl.
CPC ...... *G03F 7/70441* (2013.01); *G06F 17/5081* (2013.01)

(58) Field of Classification Search
CPC ..................... G06F 17/5081; G03F 7/70441
USPC .......................................................... 716/53
See application file for complete search history.

(56) References Cited

U.S. PATENT DOCUMENTS

| 8,762,900 | B2 | 6/2014 | Shin et al. |
| 8,796,666 | B1 | 8/2014 | Huang et al. |
| 8,812,999 | B2 | 8/2014 | Liu et al. |
| 8,850,366 | B2 | 9/2014 | Liu et al. |
| 8,906,595 | B2 | 12/2014 | Liu et al. |
| 8,954,899 | B2 | 2/2015 | Wu et al. |
| 9,093,530 | B2 | 4/2015 | Huang et al. |
| 9,367,655 | B2 | 6/2016 | Shih et al. |
| 9,390,217 | B2 | 7/2016 | Wang et al. |
| 9,548,303 | B2 | 1/2017 | Lee et al. |
| 2007/0105029 | A1* | 5/2007 | Ausschnitt .......... B81C 99/0065 430/30 |

* cited by examiner

*Primary Examiner* — Suchin Parihar
(74) *Attorney, Agent, or Firm* — Haynes and Boone, LLP

(57) ABSTRACT

Examples of optical proximity correction (OPC) based computational lithography techniques are disclosed herein. An exemplary method includes receiving an IC design layout that includes an IC feature, the IC feature specifying a mask feature for selectively exposing to radiation a portion of a photoresist disposed on a substrate; determining topographical information of an underlying layer disposed on the substrate between the photoresist and the substrate; performing an OPC process on the IC feature to generate a modified IC feature; and providing a modified IC design layout including the modified IC feature for fabricating a mask based on the modified IC design layout. The OPC process may use the topographical information of the underlying layer to compensate for an amount of radiation directed towards the portion of the photoresist so as to expose the portion of the photoresist to a target dosage of radiation.

20 Claims, 8 Drawing Sheets

OPTICAL PROXIMITY CORRECTION METHODOLOGY USING UNDERLYING LAYER INFORMATION

BACKGROUND

Challenges in integrated circuit (IC) design continue to grow as IC technologies progress towards smaller feature sizes, such as 32 nanometers, 28 nanometers, 20 nanometers, and below. For example, when fabricating IC devices, device performance may be seriously influenced by lithography printability, which indicates how well a final wafer feature formed on a wafer corresponds with a target pattern defined by an IC design layout. Various methods that focus on optimizing a mask used for projecting an image that corresponds with the target pattern on the wafer have been introduced for enhancing lithography printability, such as optical proximity correction (OPC), mask proximity correction (MPC), inverse lithography technology (ILT), and source mask optimization (SMO). Although such methods have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
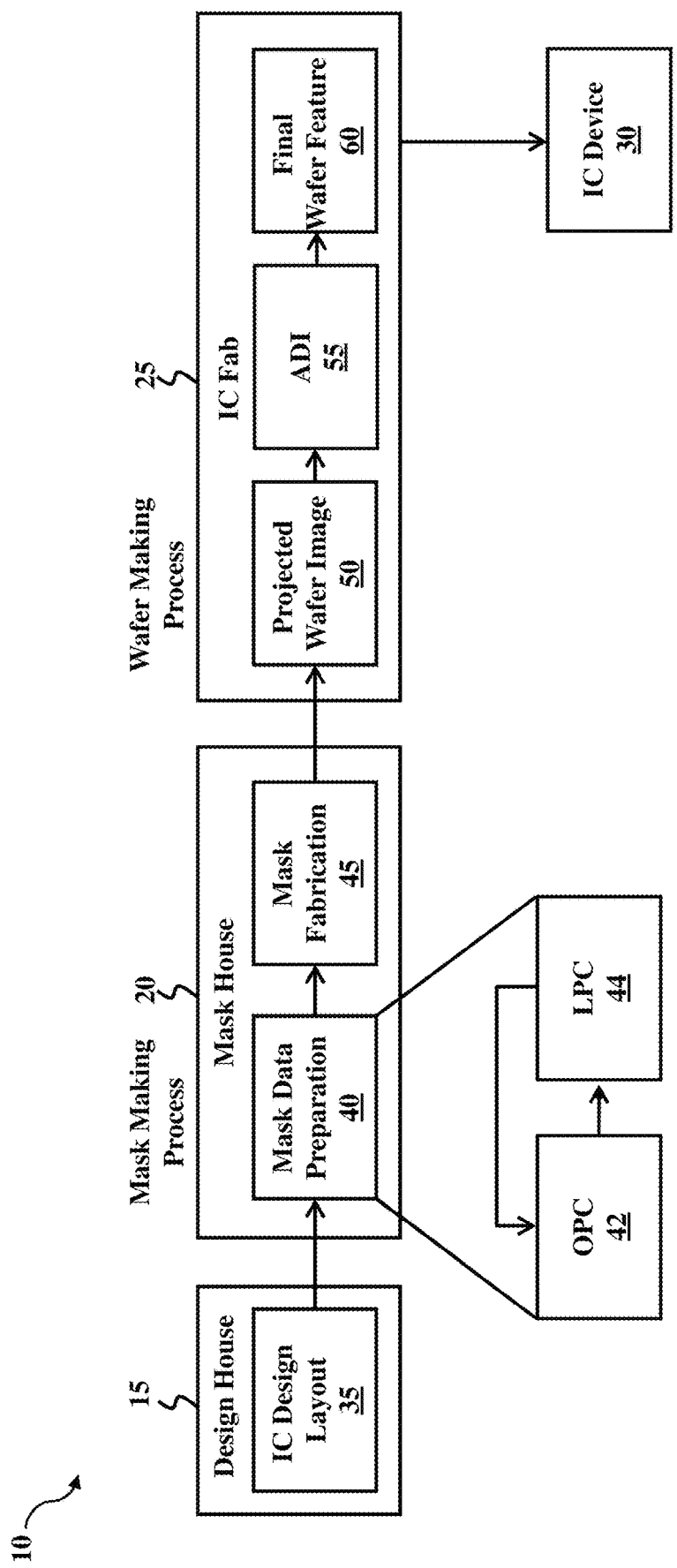
FIG. 1 is a simplified block diagram of an integrated circuit (IC) manufacturing system, along with an IC manufacturing flow associated with the IC manufacturing system, according to various embodiments of the present disclosure.

The present disclosure relates generally to lithography optimization techniques, and more particularly, to optical proximity correction (OPC) techniques.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a simplified block diagram of an integrated circuit (IC) manufacturing system 10, along with an IC manufacturing flow associated with IC manufacturing system 10, according to various embodiments of the present disclosure. IC manufacturing system 10 includes a plurality of entities—such as a design house (or design team) 15, a mask house 20, and an IC manufacturer 25 (e.g., an IC fab)—that interact with one another in design, development, and manufacturing cycles and/or services related to manufacturing an IC device 30. The plurality of entities is connected by a communication network, which may be a single network or a variety of different networks, such as an intranet and/or Internet, and may include wired and/or wireless communication channels. Each entity may interact with other entities and may provide services to and/or receive services from the other entities. One or more of design house 15, mask house 20, and IC manufacturer 25 may be owned by a single large company, and may even coexist in a common facility and use common resources.

Design house 15 generates an IC design layout 35 (also referred to as an IC design pattern). IC design layout 35 includes various circuit features (represented by geometrical shapes) designed for an IC product based on specifications of the IC product to be manufactured. The circuit features correspond to geometrical features formed in various material layers (such as metal layers, dielectric layers, and/or semiconductor layers) that combine to form IC features (components) of the IC product, such as IC device 30. For example, a portion of IC design layout 35 includes various IC features to be formed in a substrate (e.g., a silicon substrate) and/or in various material layers disposed on the substrate. The various IC features can include an active region, a gate feature (e.g., a gate dielectric and/or a gate electrode), a source/drain feature, an interconnection feature, a bonding pad feature, other IC feature, or combinations thereof. In some examples, assist features are inserted into IC design layout 35 to provide imaging effects, process enhancements, and/or identification information. A geometry proximity correction (GPC) process, similar to an OPC process used for optimizing mask patterns (mask layouts), may generate the assist features based on environmental impacts associated with IC fabrication, including etching loading effects, patterning loading effects, and/or chemical mechanical polishing (CMP) process effects.

Design house 15 implements a proper design procedure to form IC design layout 35. The design procedure may include logic design, physical design, place and route, or combinations thereof. IC design layout 35 is presented in one or more data files having information of the circuit features (geometrical patterns). In an example, IC design layout 35 is expressed in a Graphic Database System file format (such as GDS or GDSII). In another example, IC design layout 35 is expressed in another suitable file format, such as Open Artwork System Interchange Standard file format (such as OASIS or OAS).

Mask house 20 uses IC design layout 35 to manufacture one or more masks, which are used for fabricating various layers of IC device 30 according to IC design layout 35. A mask (sometimes referred to as a photomask or reticle) is a patterned substrate used in a lithography process to pattern a wafer, such as a semiconductor wafer. Mask house 20 performs mask data preparation 40, where IC design layout 35 is translated into a form that may be written by a mask writer to generate a mask. For example, IC design layout 35 is translated into machine readable instructions for a mask writer, such as an electron-beam (e-beam) writer. Mask data preparation 40 generates a mask pattern (mask layout) that corresponds with a target pattern defined by IC design layout 35. The mask pattern is generated by fracturing the target pattern of IC design layout 35 into a plurality of mask features (mask regions) suitable for a mask-making lithography process, such as an e-beam lithography process. The fracturing process may be implemented according to various factors, such as IC feature geometry, pattern density differences, and/or critical dimension (CD) differences, and the mask features are defined based on methods implemented by the mask writer for printing mask patterns.

In some examples, where an e-beam writer uses a variable-shaped beam (VSB) method for printing mask patterns, a mask pattern may be generated by fracturing IC design layout 35 into polygons (such as rectangles or trapezoids). A corresponding mask shot map may include exposure shot information for each polygon. For example, at least one corresponding exposure shot, including an exposure dose, an exposure time, and/or an exposure shape, is defined for each polygon.

In some examples, where an e-beam writer uses a character projection (CP) method for printing mask patterns, a mask pattern may be generated by fracturing IC design layout 35 into characters (typically representing complex patterns) that correspond with a stencil used by the e-beam writer. A corresponding mask shot map may include exposure shot information for each character. For example, at least one corresponding exposure shot, including an exposure dose, an exposure time, and/or an exposure shape, is defined for each character. In such examples, any portions of fractured IC design layout 35 that do not match characters in the stencil may be printed using the VSB method.

Mask data preparation 40 can include various processes for optimizing the mask pattern, such that a final pattern formed on a wafer (often referred to as a final wafer feature) by a lithography process using a mask fabricated from the mask pattern exhibits enhanced resolution and precision. For example, mask data preparation 40 includes an OPC 42, which uses lithography enhancement techniques to compensate for image distortions and errors, such as those that arise from diffraction, interference, and/or other process effects. OPC 42 can add assist features, such as scattering bars, serifs, and/or hammerheads, to the mask pattern according to optical models or optical rules in order to enhance resolution and precision of a final pattern on a wafer. In some examples, the assist features can compensate for line width differences that arise from different densities of surrounding geometries. In some examples, the assist features can prevent line end shortening and/or line end rounding. OPC 42 may further correct e-beam proximity effects and/or perform other optimization features.

In some examples, mask data preparation 40 may use a mask rule check (MRC) process to check the mask pattern after undergoing an OPC process, where the MRC process uses a set of mask creation rules. The mask creation rules can define geometric restrictions and/or connectivity restrictions to compensate for variations in IC manufacturing processes.

In some examples, mask data preparation 40 can include a lithography process check (LPC) 44, which simulates wafer making processes that will be implemented by IC manufacturer 25 to fabricate IC device 30. In some examples, LPC 44 simulates an image of a mask based on a generated mask pattern using various LPC models (or rules), which may be derived from actual processing parameters implemented by IC fab 25. The processing parameters may include parameters associated with various processes of the IC manufacturing cycle, parameters associated with tools used for manufacturing IC device 30, and/or other aspects of the manufacturing process. LPC 44 may take into account various factors, such as image contrast, depth of focus ("DOF"), mask error sensitivity or Mask Error Enhancement Factor ("MEEF"), other suitable factors, or combinations thereof. After a simulated device has been created by LPC 44, if the simulated device is not close enough in shape to satisfy design rules, certain steps in mask data preparation 40, such as OPC 42 and MRC, may be repeated to further refine the IC design layout. It should be understood that mask data preparation 40 has been simplified in the interest of clarity, and mask data preparation 40 can include additional features, processes, and/or operations for modifying the IC design layout to compensate for limitations in lithographic processes used by IC fab 25.

In addition to performing mask data preparation 40, mask house 20 also performs mask fabrication 45, where a mask is fabricated according to the mask pattern generated by mask data preparation 40. In some examples, the mask pattern is modified during mask fabrication 45 to comply with a particular mask writer and/or mask manufacturer. During mask fabrication 45, a mask making process is implemented that fabricates a mask based on the mask pattern (mask layout). A mask may include a mask substrate and a patterned mask layer, where the patterned mask layer includes a final (real) mask pattern. The final mask feature, such as a mask contour, corresponds with the mask pattern (which in turn corresponds with the target pattern provided by IC design layout 35).

In some examples, the mask is a binary mask. For example, an opaque material layer (such as chromium) may be formed over a transparent mask substrate (such as a fused quartz substrate or calcium fluoride ($CaF_2$)), and the opaque material layer may be patterned based on the mask pattern to form a mask having opaque regions and transparent regions. In some examples, the mask is a phase shift mask (PSM) that can enhance imaging resolution and quality, such as an attenuated PSM or alternating PSM. For example, a phase shifting material layer (such as molybdenum silicide (MoSi) or silicon oxide ($SiO_2$)) may be formed over a transparent mask substrate (such as a fused quartz substrate or calcium fluoride ($CaF_2$)), and the phase shifting material layer may be patterned to form a mask having partially transmitting, phase shifting regions and transmitting regions that form the mask pattern. In another example, the phase shifting material layer is a portion of the transparent mask substrate, such that the mask pattern is formed in the transparent mask substrate.

In some examples, the mask is an extreme ultraviolet (EUV) mask. For example, a reflective layer may be formed over a substrate, an absorption layer may be formed over the reflective layer, and the absorption layer (such as a tantalum boron nitride (TaBN)) may be patterned to form a mask having reflective regions that form the mask pattern. The substrate may include a low thermal expansion material (LTEM), such as fused quartz, $TiO_2$ doped $SiO_2$, or other suitable low thermal expansion materials. The reflective layer may include multiple layers formed on the substrate, where the multiple layers include a plurality of film pairs, such as molybdenum-silicide (Mo/Si) film pairs, molybdenum-beryllium (Mo/Be) film pairs, or other suitable material film pairs configured for reflecting EUV radiation (light). The EUV mask may further include a capping layer (such as ruthenium (Ru)) disposed between the reflective layer and the absorption layer. Alternatively, another reflective layer is formed over the reflective layer and patterned to form an EUV phase shift mask.

Mask fabrication 45 may use various lithography processes for fabricating a mask. For example, a mask making process may include a lithography process, which involves forming a patterned energy-sensitive resist layer on a mask material layer and transferring a pattern defined in the patterned resist layer to a mask patterning layer. The mask material layer may be an absorption layer, a phase shifting material layer, an opaque material layer, a portion of a mask substrate, and/or other suitable mask material layer. In some examples, forming the patterned energy-sensitive resist layer includes forming an energy-sensitive resist layer on the mask material layer (e.g., via spin coating), performing a charged particle beam exposure process, and performing a developing process. The charged particle beam exposure process directly "writes" a pattern into the energy-sensitive resist layer using a charged particle beam, such as an electron beam or an ion beam. Since the energy-sensitive resist layer is sensitive to charged particle beams, exposed portions of the energy-sensitive resist layer chemically change, and exposed (or non-exposed) portions of the energy-sensitive resist layer are dissolved during the developing process depending on characteristics of the energy-sensitive resist layer and characteristics of a developing solution used in the developing process. After development, the patterned resist layer includes a resist pattern that corresponds with the mask pattern. The resist pattern is then transferred to the mask material layer by any suitable process to form a final mask feature in the mask material layer. For example, the mask making process may include performing an etching process that removes portions of the mask material layer, where the etching process uses the patterned energy-sensitive resist layer as an etch mask during the etching process. After the etching process, a lithography process may remove the patterned energy-sensitive resist layer from the mask material layer, for example, using a resist stripping process.

IC manufacturer 25 (also referred to as IC fab 25), such as a semiconductor foundry, uses on or more masks fabricated by mask house 20 to fabricate IC device 30. For example, a wafer making process may use a mask to fabricate a portion of IC device 30 on a wafer. In some examples, IC manufacturer 25 performs a wafer making process numerous times using various masks to complete fabrication of IC device 30. Depending on the IC fabrication stage, a wafer can include various material layers and/or IC features (e.g., doped features, gate features, source/drain features, and/or interconnect features) when undergoing the wafer making process. The wafer making process includes a lithography process, which involves forming a patterned resist layer on a wafer material layer using a mask (e.g., the mask fabricated by mask house 20) and transferring a pattern defined in the patterned resist layer to the wafer material layer. The wafer material layer may be a dielectric layer, a semiconductor layer, a conductive layer, a portion of a substrate, and/or other suitable wafer material layer.

Forming the patterned resist layer can include forming a resist layer on the wafer material layer (e.g., by spin coating), performing a pre-exposure baking process, performing an exposure process using the mask (including mask alignment), performing a post-exposure baking process, and performing a developing process. During the exposure process, the resist layer is exposed to radiation energy (such as ultraviolet (UV) light, deep UV (DUV) light, or extreme UV (EUV) light) using an illumination source. The mask blocks, transmits, or reflects radiation to the resist layer depending on a final mask feature of the mask and/or mask type (e.g., binary mask, phase shift mask, or EUV mask), such that an image is projected onto the resist layer that corresponds with the final mask feature. This image is referred to herein as a projected wafer image 50. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the final mask feature. An after development inspection (ADI) 55 may be performed to capture information associated with the resist pattern, such as critical dimension uniformity (CDU) information, overlay information, and/or defect information.

Transferring a resist pattern defined in a patterned resist layer to a wafer material layer may be accomplished in numerous ways, such that a final wafer feature 60 is formed in the wafer material layer. For example, the wafer making process can include an implantation process that forms various doped regions/features in the wafer material layer, where the patterned resist layer is used as an implantation mask during the implantation process. In another example, the wafer making process can include an etching process that uses the patterned resist layer as an etch mask to remove portions of the wafer material layer. After an implantation process or an etching process, the lithography process includes removing the patterned resist layer from the wafer, for example, by a resist stripping process. In yet another example, the wafer making process can include a deposition process that fills openings in the patterned resist layer (formed by the removed portions of the resist layer) with a dielectric material, a semiconductor material, or a conductive material. In such examples, removing the patterned resist layer leaves a wafer material layer patterned with a negative image of the patterned resist layer. An after etch inspection (AEI) may be performed to capture information, such as critical dimension uniformity (CDU), associated with the final wafer feature 60 formed in the wafer material layer.

Ideally, final wafer feature 60 matches the target pattern defined by IC design layout 35. However, due to various factors associated with the mask making process and the wafer making process, a final mask feature formed on a mask often differs from a mask pattern (generated from the target pattern defined by IC design layout 35), causing final wafer feature 60 formed on the wafer to differ from a target pattern. For example, mask writing blur (such as e-beam writing blur) and/or other mask-making factors may cause variances between the final mask feature and the mask pattern, which in turn causes variances between final wafer feature 60 and the target pattern. Various factors associated with the wafer making process (such as resist blur, mask diffraction, projection imaging resolution, acid diffusion, etching bias, and/or other wafer making factors) further exacerbate variances between final wafer feature 60 and the target pattern.

To minimize or eliminate such variances, computational lithography helps enhance and optimize the mask making process and the wafer making process. Computational lithography may be techniques implementing computationally-intensive physical models and/or empirical models to predict and optimize IC feature patterning. The physical models and/or the empirical models are based on phenomena that affect lithographic process results, such as imaging effects (e.g., diffraction and/or interference) and/or resist chemistry. IC manufacturing system 10 can implement such techniques to generate optimal settings for the mask making process (often referred to as mask optimization) and/or the wafer making process (often referred to as source optimization, wave front engineering, and/or target optimization). For example, IC manufacturing system 10 can implement OPC, MRC, LPC, and/or inverse lithography technology (ILT) techniques to generate a shape for a final mask feature of a mask fabricated by mask house 20 that optimizes projected wafer image 50 so that projected wafer image 50 may correspond as closely as possible with the target pattern of IC design layout 35.

Figure 2:
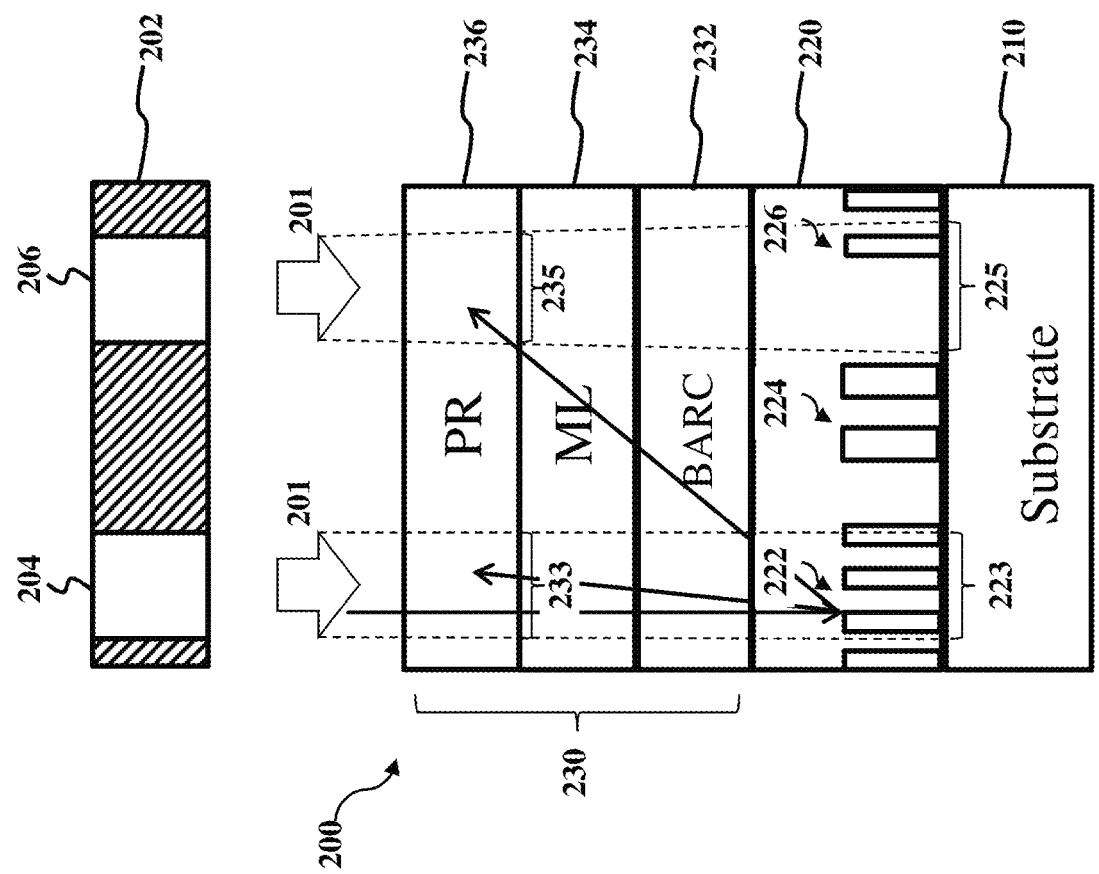
FIG. 2 is a schematic diagram showing a cross-sectional side view of an IC device according to various embodiments of the present disclosure.

FIG. 2 is a schematic diagram showing a cross-sectional side view of an IC device 200 according to some embodiments. As shown in FIG. 2, IC device 200 is a multi-layer structure, which may be manufactured using IC manufacturing system 10 (e.g., as IC device 30 or as an intermediate device that leads to IC device 30). Fabrication of IC device 200 is a multi-layer process that may proceed from bottom-to-top. As further described below, the topography of an underlying layer may affect the patterning of a layer disposed above it, and in some examples, the patterning processes compensate for this effect by considering the topographical information of the underlying layer.

The layers and features of the IC device 200 may be formed in and over a substrate 210. In various examples, the substrate 210 includes an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, and/or calcium fluoride (CaF2); and/or combinations thereof.

The substrate 210 may be uniform in composition or may include various layers, some of which may be selectively etched to form the fins. The layers may have similar or different compositions, and in various embodiments, some substrate layers have non-uniform compositions to induce device strain and thereby tune device performance. Examples of layered substrates include silicon-on-insulator (SOI) substrates 210. In some such examples, a layer of the substrate 210 may include an insulator such as a semiconductor oxide, a semiconductor nitride, a semiconductor oxynitride, a semiconductor carbide, and/or other suitable insulator materials.

An exemplary layer 220 is formed over substrate 210. Layer 220 may represent any number of layers with any suitable composition. In various examples, layer 220 includes semiconductor material, dielectric material, and/or conductive material, and one such example, layer 220 represents an Inter-Level Dielectric (ILD) that contains a semiconductor oxide, a semiconductor nitride, a semiconductor carbide, FluoroSilicate Glass (FSG), a low-K dielectric material, and/or other suitable materials. Various final wafer features 222, 224, and 226 may be created within layer 220. Final wafer features 222, 224, and 226 may each comprise different materials, which may also be different from the material of layer 220. As further discussed below, the topography of such final wafer features in layer 220 may impact the lithography of overlying layers.

Next, a patterning stack 230 is formed on the underlying layer 220. Although not shown in FIG. 2, it should be understood that more underlying layers may be formed between patterning stack 230 and underlying layer 220. In some examples, patterning stack 230 comprises a bottom anti-reflective coating (BARC) layer 232, a middle layer (ML) 234, and a photoresist (PR) layer 236, which may be collectively referred to as a tri-layer structure or tri-layer patterning stack. In such examples, to reduce optical reflections from substrate 210 and underlying layer 220, BARC layer 232 is formed over underlying layer 220. The BARC layer 232 may include any suitable material and may be formed to any suitable thickness. In various examples, BARC layer 232 comprises an organic anti-reflective coating material and has a thickness of between about 600 Å to about 2000 Å.

Next, middle layer 234 is formed over BARC layer 232. The middle layer 234 may include any suitable material such as silicon oxide, or silane oxide. In various examples, the middle layer 234 has a thickness between about 200 Å to about 500 Å. A photoresist layer 236 is disposed over the middle layer 234 by spin coating or other suitable technique. The photoresist layer 236 may include any suitable positive or negative photoresist, and in various examples, photoresist layer 236 has a thickness between about 550 Å to about 950 Å. Although not shown in FIG. 2, in some examples, patterning stack 230 may be a single layer of photoresist situated on top of underlying layer 220.

In some examples, an IC design layout including original IC features is to be fabricated in photoresist layer 236. A mask 202 may be used to pattern photoresist layer 236, and for that, photoresist layer 236 is sometimes considered a patterning layer or a current layer that is separated from underlying layer 220 by BARC layer 232 and middle layer 234. Patterns are formed in photoresist layer 236 using a lithography process, where radiation energy 201 exposes selective areas of photoresist layer 236 using mask 202, which has final mask features 204 and 206, thereby generating (after post-exposure procedures) final wafer features that ideally match the original IC features. Note that radiation energy 201 may be generated from any suitable source and may either penetrate through mask 202 or be reflected from mask 202 (e.g., a reflective mask used in extreme ultraviolet lithography) before reaching photoresist layer 236.

In the lithography process, when a radiation source is exposing selective areas of patterning stack 230 situated above underlying layer 220, part of the radiation energy may penetrate through patterning stack 230 to reach underlying layer 220. Since underlying layer 220 may not absorb all radiation energy (even with BARC layer 232), some of the radiation energy may bounce back (i.e., reflect) from underlying layer 220 to expose patterning stack 230 for a second time. Therefore, the amount of radiation energy received by a given point in patterning stack 230 is impacted by the amount of radiation energy reflected from underlying layer 220, which in turn depends on the topography of underlying layer 220. Accordingly, in order to generate final wafer features in patterning stack 230 that more closely resemble original IC features in an IC design layout, topographical information of underlying layer 220 may be determined and compensated for at an early stage. In the present disclosure, an OPC process (e.g., OPC 42 in FIG. 1) is used to compensate for such topographical information.

An example of topography compensation techniques to offset multi-layer stack effect is illustrated in FIG. 2. In an embodiment, two identical IC features (represented by final mask features 204 and 206) may specify mask features for selectively exposing to radiation portions or areas 233 and 235 of photoresist layer 236, respectively. Since underlying layer 220 has uneven topography in two areas 223 and 225 (e.g., different pattern density and/or materials) that correspond to areas 233 and 235 of photoresist layer 236, respectively, the amount of reflected radiation energy received by areas 233 and 235 of photoresist layer 236 from underlying layer 220 may differ. To compensate for such a difference in reflected radiation energy, when fabricating mask 202, final mask features 204 and 206 can be adjusted differently. For example, if area 233 of photoresist layer 236 is to receive more reflected radiation energy from underlying layer 220 than area 235 of photoresist layer 236, final mask feature 204 may be narrowed at certain points, or final mask feature 206 may be widened at certain points, or both. Since final mask features 204 and 206 are affected by an OPC process, the OPC process may modify two identical IC features differently due to different topographies in areas 223 and 225. The OPC process may use the topographical information of underlying layer 220 to compensate for an amount of radiation directed towards selected portions of photoresist layer 236 (areas 233 and 235) so as to expose the selected portions of photoresist layer 236 to a target dosage of radiation. The target dosage of radiation may be determined by an original IC feature (or an IC feature under ideal lithography conditions) but may not be completely met by an actual dosage of radiation to the selected portions of photoresist layer 236 (even with topography compensation techniques disclosed herein).

Areas 223 and 225 of underlying layer 220 direct radiation, by reflection, toward areas 233 and 235 of photoresist layer 236, respectively, where IC features are to be formed. Note that, although areas 223 and 225 of underlying layer 220 correspond to areas 233 and 235 of photoresist layer 236 (and to final mask features 204 and 206), respectively, areas 223 and 225 may not be limited to areas that are disposed directly under (and identical in coverage with) areas 233 and 235, respectively. Optical reflections may not be vertical due to various reasons (e.g., interface roughness between substrate 210 and underlying layer 220; sloped sidewalls on final wafer features 222, 224, and 226 that reflect light sideways). For example, as illustrated in FIG. 2 by arrows, radiation may penetrate area 233 to reach area 223, but due to feature 222 a portion of the same radiation may be directed back toward area 233, or area 235, or both. Instead, areas 223 and 225 may be any areas from which reflected radiation energy impacts areas 233 and 235. In some examples, areas 223 and 225 may overlap in underlying layer 220. Each of areas 223 and 225 may cover most or all of the exposed region of underlying layer 220 (e.g., any point in underlying layer 220 may reflect radiation energy back to area 233 and/or area 235).

In addition to underlying layer 220, other layers including substrate 210, BARC layer 232, and middle layer 234 also have areas corresponding to areas 233 and 235 of photoresist layer 236 and may also impact the amount of radiation energy received by areas 233 and 235 of photoresist layer 236. In some examples, these layers are also considered underlying layers and optical reflections from them are compensated for. Sometimes, substrate 210, BARC layer 232, and middle layer 234 may not have uneven patterns incorporated therein and therefore are less likely than underlying layer 220 to direct different amounts of reflected energy toward areas 233 and 235. Therefore, in some examples, optical reflections from substrate 210, BARC layer 232, and middle layer 234 are not compensated for. Note that optical reflections from additional underlying layers, if present (e.g., below layer 220 or between layer 220 and stack 230), may also be taken into account during OPC.

According to some embodiments disclosed herein, BARC layer 232 may be removed since an OPC process already compensates for optical reflections from underlying layers. That is, in some examples, BARC layer 232 is absent. The elimination of BARC layer 232 simplifies fabrication process and saves cost.

Figure 4:
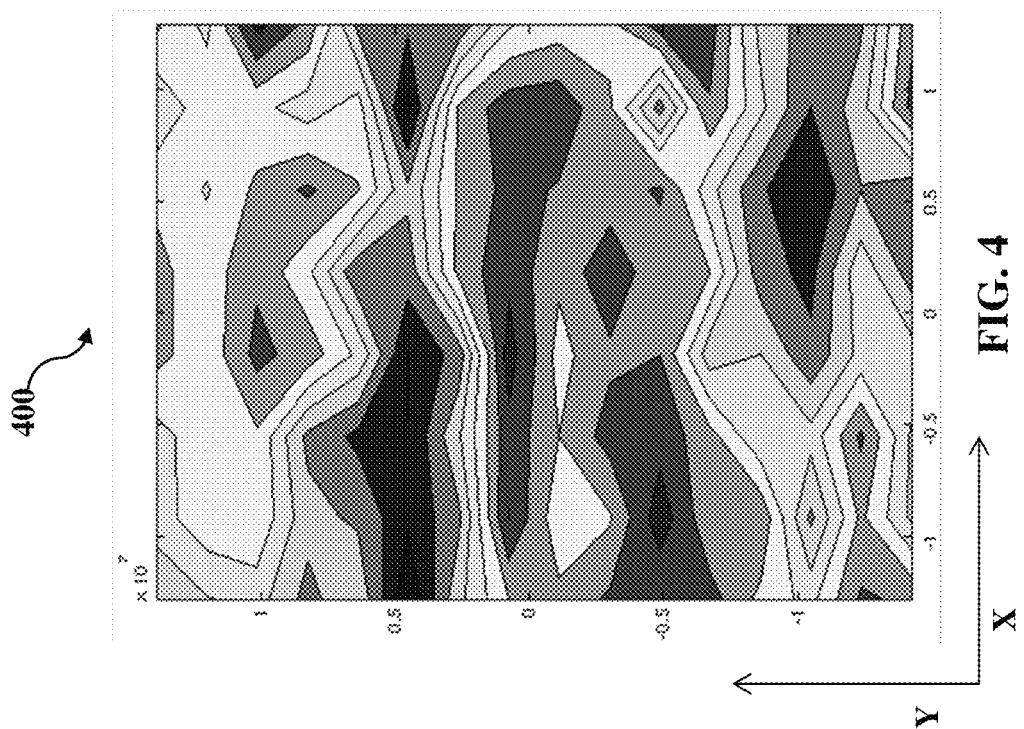
FIG. 4 a schematic diagram showing an example reflectivity correction map according to various embodiments of the present disclosure.

In addition to compensating for topography of one or more underlying layers, an OPC process disclosed herein may compensate for topography of a layer currently being patterned (or current layer). For example, as shown in FIG. 2, a density of features to be fabricated in the vicinity of area 233 of photoresist layer 236 may be a factor for adjusting final mask feature 204. In FIG. 4, correction map 400 may be generated by further compensating for a pattern density in photoresist layer 236. The vicinity area is an area of the current layer that can direct radiation toward the target portion of the current layer and thus impact the formation of final features in the current layer. In some examples, the vicinity area extends out from the target area (e.g., area 233) for tens to hundreds of micrometers (e.g., 50 μm, 100 μm). Taking into account the pattern density in a relatively large vicinity area allows the OPC process to further compensate for optical impacts of other features in the current layer, which further improves OPC accuracy.

Figure 3:
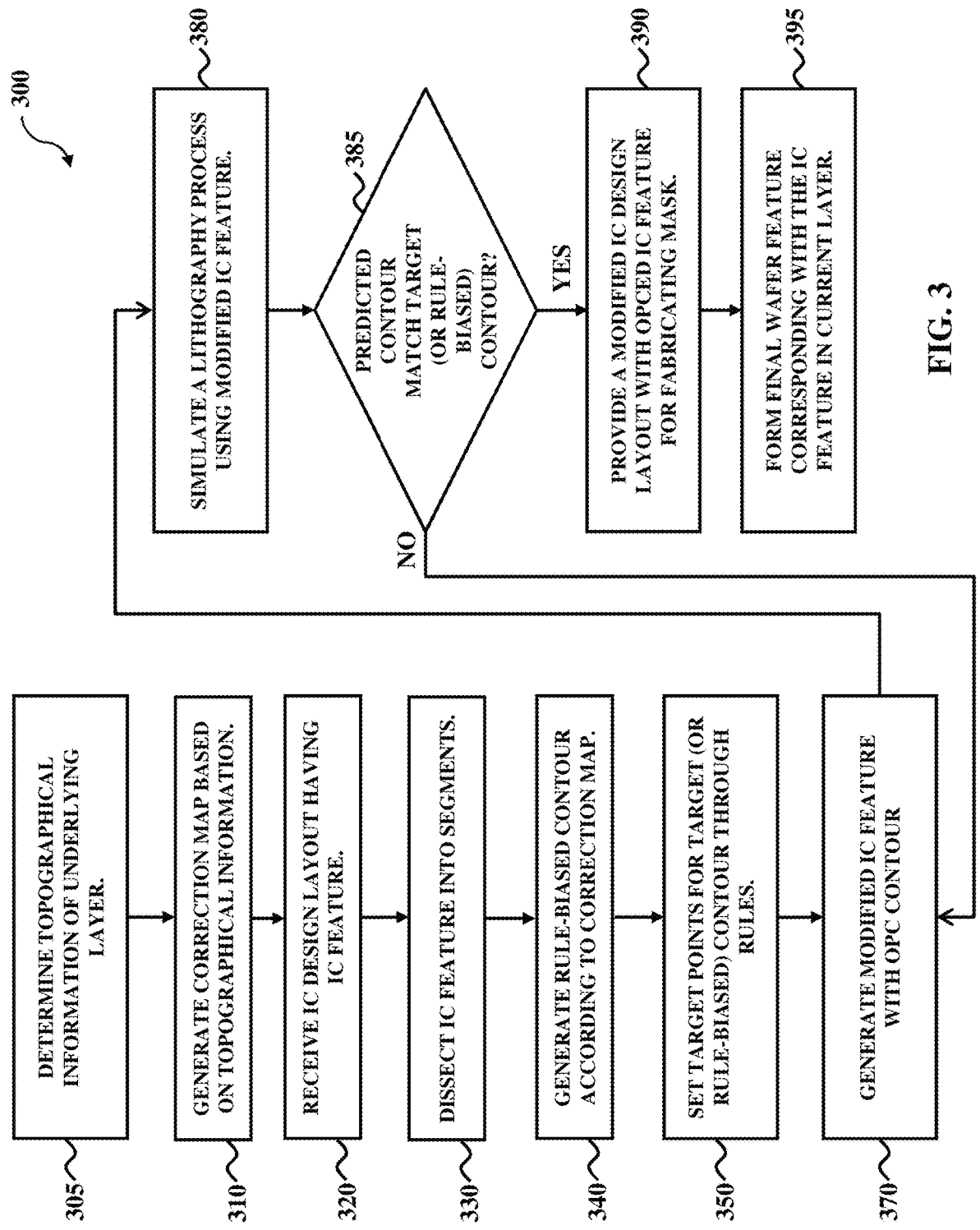
FIG. 3 is a flowchart of an optical proximity correction (OPC) based computational lithography method according to various embodiments of the present disclosure.
Figure 6:
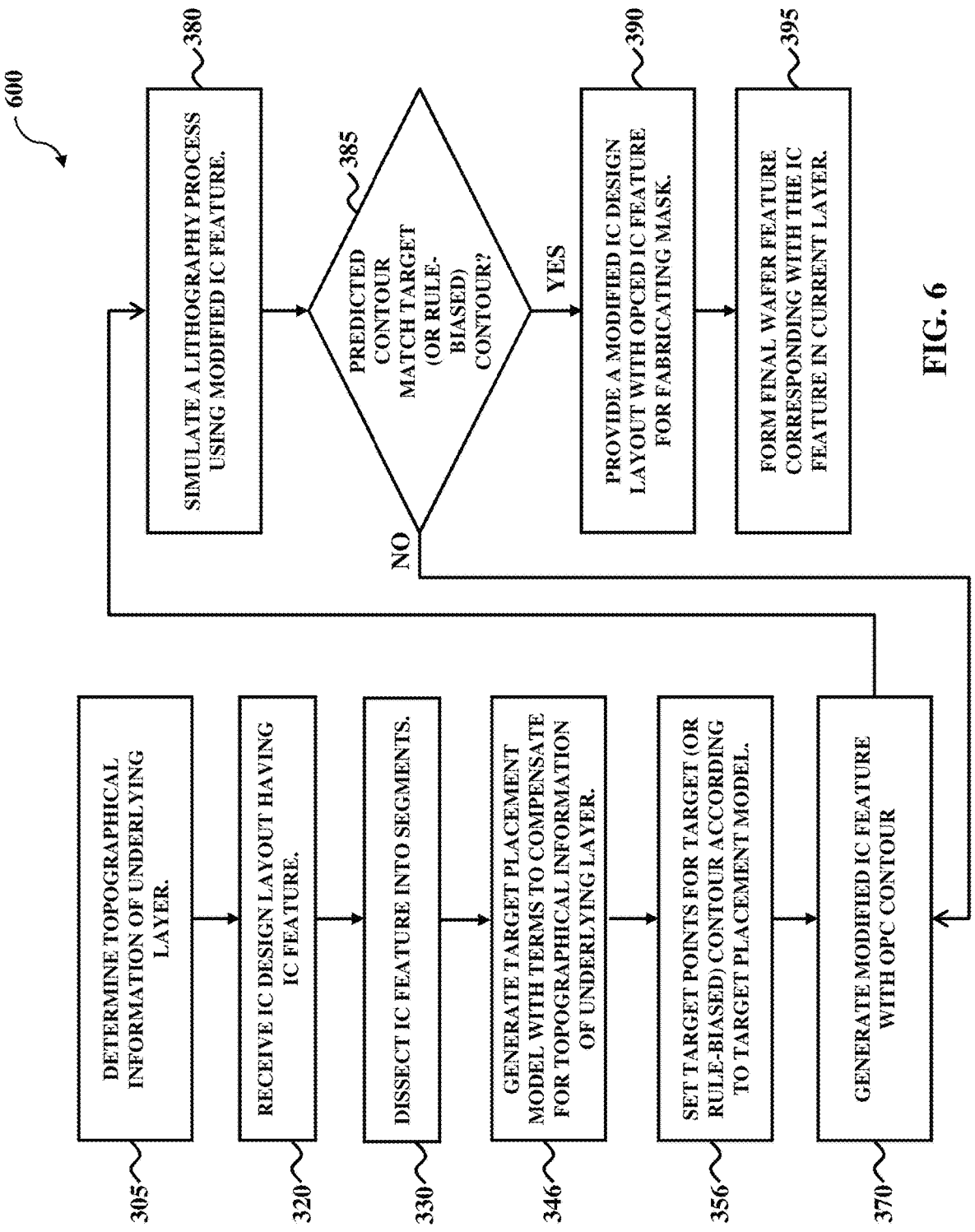
FIG. 6 is a flowchart of another OPC based computational lithography method according to various embodiments of the present disclosure.
Figure 7:
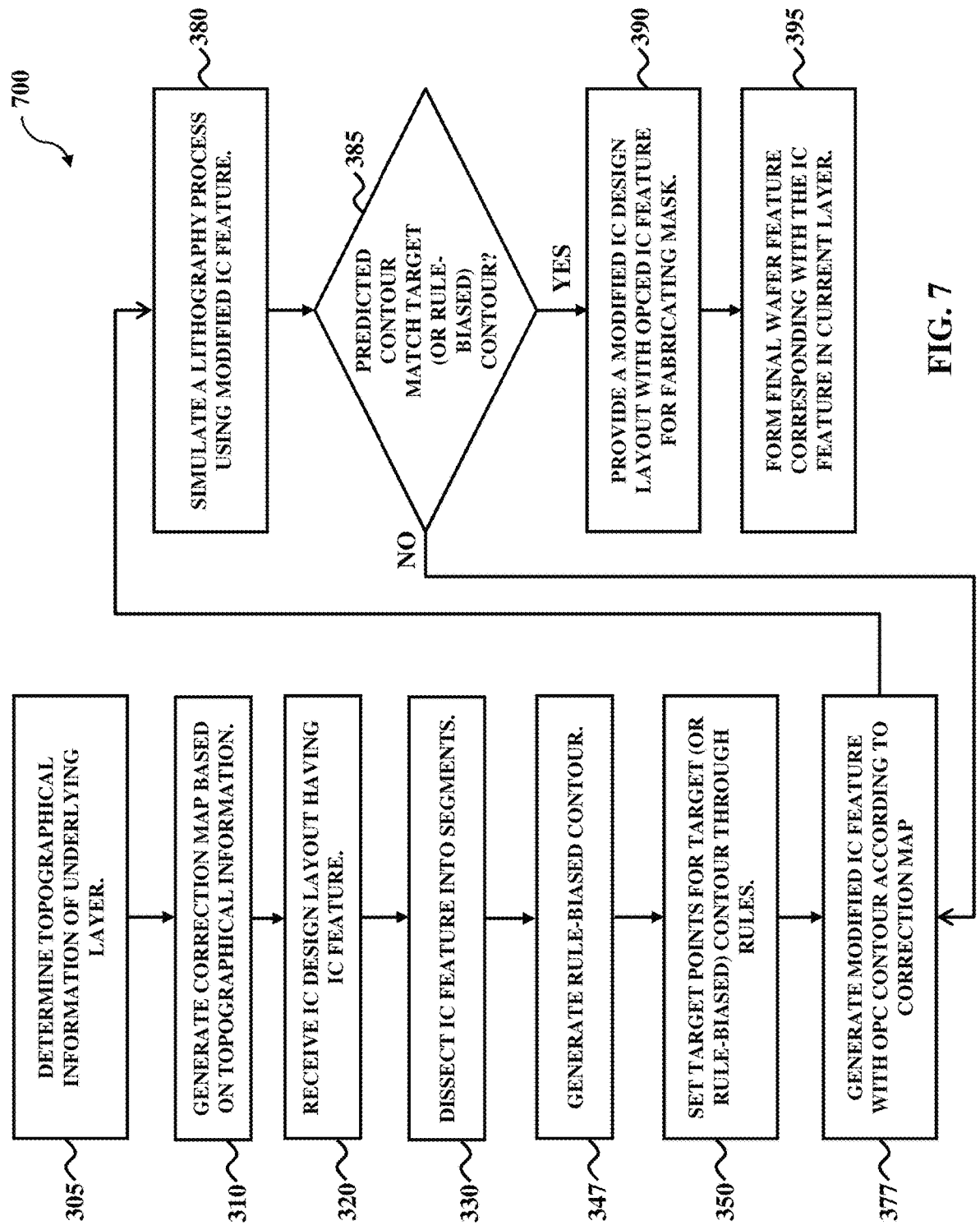
FIG. 7 is a flowchart of yet another OPC based computational lithography method according to various embodiments of the present disclosure.

Since an OPC process has different steps and can use various approaches (e.g., rule-based retargeting and model-based retargeting), the topography compensation techniques disclosed herein may be incorporated into the OPC process in various manners and at various stages. FIGS. 3, 6, and 7 are example flowcharts illustrating how such topography compensation works in the OPC process and in the overall process of IC fabrication.

FIG. 3 is a flowchart of a computational lithography method 300 according to various embodiments of the present disclosure. Computational lithography method 300 may be implemented by IC manufacturing system 10 of FIG. 1, where design house 15, mask house 20, and/or IC manufacturer 25 can perform (or collaborate to perform) computational lithography method 300 to manufacture an IC device (e.g., IC device 200). For example, lithography method 300 may modify an original IC feature, which is designed for fabrication in patterning stack 230 of FIG. 2, by compensating for topographical information of underlying layers. In some examples, mask data preparation 40 of IC manufacturing system 10 implements computational lithography method 300. Computational lithography method 300 is an OPC-based computational lithography process, which uses lithography enhancement techniques to compensate for image distortions and errors, such as those arising from diffraction, interference, or other process effects. Computational lithography method 300 generates a mask pattern (from which a mask may be fabricated) by modifying an IC design layout to compensate for the image distortion and errors. FIG. 3 has been simplified for the sake of clarity to better understand the inventive concepts of the present disclosure. It is understood that additional steps can be provided before, during, and after the method 300 and that some of the steps described can be replaced or eliminated for other embodiments of the method 300. Unless otherwise noted, the processes of the method 300 may be performed in any order including concurrently.

At block 305, topographical information of one or more underlying layers is determined. An underlying layer (e.g., underlying layer 220) may sit below a current layer (e.g., photoresist layer 236) to be patterned. For example, before patterning photoresist layer 236, topographical information of underlying layer 220 is determined. The topographical information may account for factors that impact optical properties of underlying layer 220, which in turn impact the amount of radiation energy received by selective portions of photoresist layer 236.

In some examples, topographical information includes factors such as global coordinates, underlying layer pattern density, as well as underlying layer refractive index ("n"), absorption rate ("k"), and thickness ("t") information. For example, topographical information of underlying layer 220 may include global X-Y coordinates of points (or pixels if points are represented by pixels based on coordinate units such as 0.1 µm, 1 µm, etc.) in underlying layer 220, a pattern density of underlying layer 220, and n/k/t information of underlying layer 220. The pattern density of underlying layer 220 may describe how much of the layer 220 is covered by features (e.g., final wafer features 222, 224, and 226) in a top view, which depends on feature distribution, spacing, shapes, and dimensions. As shown in FIG. 2, area 223 of underlying layer 220 has a pattern density higher than that of area 225. In some examples, each n/k/t information may represent a composite or combined value. For example, since underlying layer 220 may comprise a plurality of materials at different points, and each material has a different refractive index, the refractive index information of underlying layer 220 may account for the optical effects of all such materials at all points. Similarly, the absorption rate (or equivalently, reflectivity) of each material may also vary, so the absorption information of underlying layer 220 may account for the optical effects of all such materials at all points. Also similarly, since underlying layer 220 may comprise features (e.g., final wafer features 222, 224, and 226) each with a different height or thickness, the thickness information of underlying layer 220 may account for the total thickness or effective thickness of underlying layer 220. In addition, determining the topographical information of underlying layer 220 may cover the entire area of underlying layer 220 or a portion of underlying layer 220 that impacts the lithography of upper layers.

At block 310, computational lithography method 300 generates a reflectivity correction map based on the determined topographical information of the underlying layer (e.g., underlying layer 220). FIG. 4 illustrates the simulation result of an example reflectivity correction map 400 (top view) according to various embodiments of the present disclosure. Correction map 400 represents the optical effect of the underlying layer towards a current layer being patterned. For example, correction map 400 maps an amount of radiation directed towards photoresist layer 236 by underlying layer 220 across photoresist layer 236. The optical effect or impact may be represented in various ways such as radiation intensity (in color-coded scale or grey scale) or real CD compensation values for all coordinates of photoresist layer 236. Correction map 400 may be generated by taking into account the topographical information of underlying layer 220. Any suitable process may be used to generate correction map 400 to account for topographical information such as global X-Y coordinates of points in underlying layer 220, a pattern density of underlying layer 220, and n/k/t information of underlying layer 220. In some examples, correction map 400 normalizes the topographical information into indices and transforms the topographical information into radiation intensity or real CD compensation values. For example, each of the factors (including pattern density of underlying layer 220 and n/k/t information of underlying layer 220) may be assigned a suitable weight or index, and the weights or indices may be added together to determine a radiation intensity or CD compensation value.

In a later OPC process, the radiation intensity or CD compensation values may be used to modify an IC feature that is configured for fabrication in the current layer. For example, as shown in FIG. 4, a first point in the correction map may have global coordinates X and Y in underlying layer 220 and a radiation intensity or CD compensation value. An IC feature is configured for fabrication in photoresist layer 236, and a contour of the IC feature has a second point with the same global coordinates X and Y (but in photoresist layer 236). Correction map 400 can be used in an OPC process so that a rule-biased contour for the IC feature, target points for the IC feature, or an OPC contour for the IC feature at the second point takes into accounts the radiation intensity or CD compensation value of the first point in correction map 400.

It should be understood that the timing of executing blocks 305 and 310 is flexible. Therefore, blocks 310 and 310 do not have to precede certain steps of method 300, such as blocks 320 and 330 discussed below. In some embodiments, determining topographical information of underlying layer 220 (block 305) and generating correction map 400 (block 310) are performed well in advance, before receiving any IC design layout for patterning stack 230. In other examples, to save unnecessary computation, blocks 305 and 310 are performed after receiving an IC design layout for patterning stack 230. Further, block 310 may be skipped in some examples of model-based OPC processes, where the topographical information of an underlying layer is used as mathematical terms of an OPC model without any correction map.

Although computational lithography method 300 illustrates using a correction map to compensate for topography of an underlying layer, it should be understood that the correction map may additionally compensate for topography of a current layer by accounting for factors such as current layer pattern density. In some examples, block 305 may additionally determine topographical information of patterning stack 230 by accounting for a pattern density in an area of patterning stack 230 that corresponds to an IC feature to be fabricated in patterning stack 230. Block 310 may generate correction map 400 by taking into account such additional topographical information.

At block 320, computational lithography method 300 includes receiving an IC design layout, such as IC design layout 35, for a target pattern. The IC design layout is presented in one or more data files having information of the target pattern. For example, the IC design layout is received in a GDSII file format or an OASIS file format. The IC design layout includes various IC features (represented by geometrical shapes) designed for an IC product to be manufactured, for example, by IC manufacturing system 10. The IC features may be formed in various material layers (e.g., metal layers, dielectric layers, and/or semiconductor layers) that combine to form IC features of the IC product. In some examples, the IC features specify mask features (e.g., final mask features 204 and 206) on a mask for selectively exposing to radiation portions of a photoresist (e.g., areas 233 and 235 of photoresist layer 236) disposed on a substrate (e.g., substrate 210).

Figure 5E:
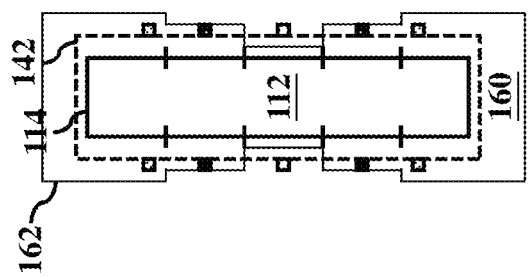
FIGS. 5A-5E are schematic diagram (top views) of an IC feature undergoing a lithography optimization process according to various embodiments of the present disclosure.
Figure 5D:
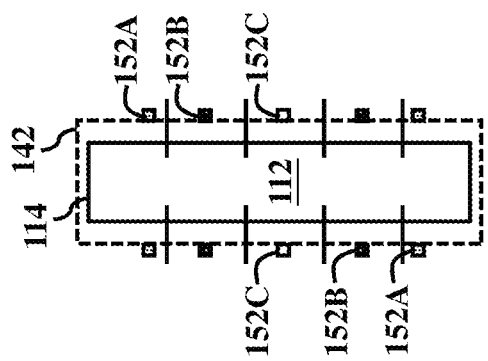
Figure 5C:
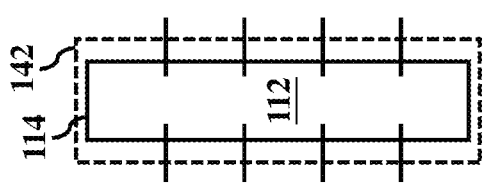
Figure 5B:
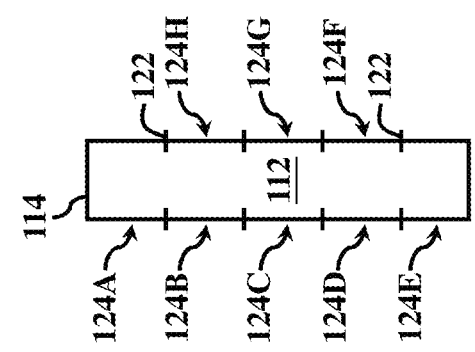
Figure 5A:
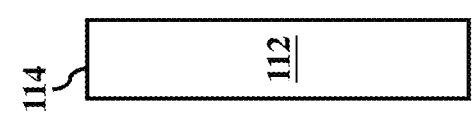

FIG. 5A is a schematic diagrammatic top view of an IC feature 112 according to various embodiments of the present disclosure. IC feature 112 may be included in an IC design layout, such as IC design layout 35, which may include a plurality of IC features. A group of IC features may form IC patterns. IC feature 112 is a geometrical pattern (e.g., a rectangle) that represents an IC feature, which constitutes a portion of an IC device, such as IC device 30 or IC device 200. IC feature 112 can represent an active region, a gate feature (e.g., a gate electrode), a source/drain region (or feature), an interconnection feature (e.g., a metal interconnect line), a bonding pad feature, or other IC feature. In FIG. 5A, a target (original) contour 114 defines a shape of the IC feature to be formed on a wafer given ideal lithographic process conditions. Ideally, when a final IC feature (e.g., final wafer feature 60 of FIG. 1) corresponding with IC feature 112 is formed on a substrate (e.g., substrate 210 which may be a wafer), the final IC feature has a contour that matches target contour 114. In some examples, a mask includes a mask feature corresponding to IC feature 112, such that when exposed to radiation during lithography, a projected wafer image (e.g., projected wafer image 50) formed on the wafer corresponds to IC feature 112 having target contour 114.

Referring back to FIG. 3, at block 330, computational lithography method 300 proceeds with dissecting (fragmenting) at least one IC feature of an IC design layout. Dissecting involves dividing a target contour of the IC feature into discrete segments, each of which may be modified independently (e.g., with a positive bias or a negative bias) during an OPC process. In some examples, where the IC design layout includes more than one IC feature, a target contour of each IC feature may be dissected into discrete segments.

FIG. 5B is a schematic diagrammatic top view of an IC feature, such as IC feature 112, after undergoing a dissection process according to various embodiments of the present disclosure. In FIG. 5B, target contour 114 is divided into segments by dissection (stitching) points 122, which serve as boundaries between segments. For example, target contour 114 is dissected into eight discrete segments including a segment 124A, a segment 124B, a segment 124C, a segment 124D, a segment 124E, a segment 124F, a segment 124G, and a segment 124H. Each of segments 124A-124H is a portion of target contour 114 defined between adjacent dissection points 122. The present disclosure contemplates any suitable methodology for placing dissection points 122 along target contour 114.

Turning again to FIG. 3, at block 340, computational lithography method 300 proceeds with generating a rule-biased contour for the at least one IC feature based on a correction map. This process is often referred to as rule-based retargeting of an IC design layout, which effectively calibrates any OPC model(s) used during computational lithography method 300. The rule-based retargeting may be implemented, for example, when model-based OPC techniques do not provide sufficient process windows for advanced technology nodes. The rule-biased contour may be generated by adjusting (modifying) the target contour according to one or more rules based on the correction map that has been calculated or generated. The rules can compensate for various conditions—such as de-focus conditions, exposure conditions (energy bias), mask conditions (mask bias) associated with imaging a mask pattern (typically an OPCed IC feature), etching conditions (etch bias), other conditions, or combinations thereof—that may not be captured by the OPC model(s), thereby improving printability of the IC feature. The rules may also improve process windows (e.g., a distribution of IC metrics (e.g., CD, normalized image log slope (NILS), and/or sensitivity to mask CD errors (MEEF)) to meet IC specification requirements over a range of process conditions. For example, though an isolated line often has a smaller process window than a dense line, it has been observed that increasing a size of the isolated line can enlarge the process window. Accordingly, a rule can define how to modify a target contour of an isolated line to generate a rule-biased contour that results in an enlarged isolated line, thereby improving the process window.

In some examples, computational lithography method 300 may use a rule table for generating the rule-biased contour. The rule table can store rules. In some examples, the rule-biased contour is generated by applying a math function and/or logic operation to the target contour. Such math functions may include a Hermite polynomial, a Bezier curve, a Lagrange polynomial, a Gaussian function, a divergence function, a Bessel function, other suitable math function, or combinations thereof.

In some examples, a rule-biased contour is generated by selectively biasing or shifting certain segments of a target contour (generated at block 330) based on one or more rules. For example, in FIG. 5C, a rule-biased contour 142 is generated for IC feature 112 by biasing segments 124A-124H according to various rules that take a reflectivity correction map (e.g., correction map 400) into account. As illustrated in FIG. 5C, segments 124A-124H are moved outward from their original locations according to the various rules, thereby enlarging a contour of IC feature 112. Enlarging a contour of IC feature 112 may help compensate for the comparative lack of optical reflection from an area that sits in an underlying layer and corresponds to the IC feature 112. On the contrary, if the corresponding area in the underlying layer generates more optical reflections than other areas due to its topography, the contour of IC feature 112 may be shrunk.

Turning again to FIG. 3, at block 350, computational lithography method 300 proceeds with setting or computing target points for the target contour (or the rule-biased contour) through the rules. In some examples, at least one target point may be set for (assigned to) each discrete segment, such that target points are spaced at locations along the target contour (or the rule-biased contour). A target placement model may predict the location of a contour of an IC feature after undergoing an OPC process (referred to herein as a predicted OPC contour), such that target points may be generated at locations along a contour associated with the IC feature to better approximate an OPC contour.

FIG. 5D is a schematic diagrammatic top view of an IC feature, such as IC feature 112, after undergoing a target placement process according to various embodiments of the present disclosure. In FIG. 5D, target points are placed along rule-biased contour 142, though the present disclosure also contemplates placing the target points along target contour 114. In some examples, target points 152A, target points 152B, and/or target points 152C can further be generated based on a target placement rule and/or a target placement model.

At block 370, computational lithography method 300 generates an OPCed IC design layout (also referred to as a modified IC design layout) including an OPCed IC feature with an OPC contour. The OPC contour defines a perimeter of the OPCed (or modified) IC feature. The OPC contour modifies (e.g., resizes, reshapes, and/or repositions) a shape of at least one IC feature according to compact models (sometimes referred to as model-based OPC) and/or rules (referred to as rule-based OPC), such that after a lithography process, a final wafer feature exhibits enhanced resolution and precision. In particular, OPC modifies a contour corresponding with the IC feature (e.g., target contour 114 or rule-biased contour 142) to generate an OPC contour. FIG. 5E is a schematic diagrammatic top view of an IC feature, such as IC feature 112, after undergoing an OPC process to become a modified IC feature 160, according to various embodiments of the present disclosure. In FIG. 5E, OPC modifies rule-biased contour 142 (or target contour 114 if no rule-biased contour is used, e.g., in certain model-based OPC processes), thereby generating an OPC contour 162 that defines modified IC feature 160. In particular, OPC shifts a relative position of segments 124A-124H (e.g., positively or negatively biased independently).

Rule-based OPC biases segments of at least one IC feature according to a set of pre-defined OPC rules (in some examples, depending on a size, shape, and/or environment of the segments). In contrast, model-based OPC biases segments based on a deviation at target points between a target contour and a predicted IC contour. The predicted IC contour may be generated by simulating a lithography process, which is based on an OPC model and which exposes a mask having a mask pattern including the IC feature, where an image of the mask pattern is transferred to a wafer (e.g., projected wafer image 50). By performing OPC using OPC rules and/or OPC models that take a correction map into account, computational lithography method 300 may compensate for topographical information (including current layer information and underlying layer information) to optimize the OPC contour.

In some examples, OPC can add assistant features (AFs), such as scattering bars, serifs, and/or hammerheads, to an IC feature. In some examples, OPC distorts the IC feature to balance image intensity, for example, removing portions of the IC feature to reduce over-exposed regions and adding AFs to the IC feature to enhance under-exposed regions. In some examples, AFs compensate for line width differences that arise from different densities of surrounding geometries. In some examples, AFs can prevent line end shortening and/or line end rounding. In some examples, OPC can further modify the IC feature to correct for e-beam proximity effects and/or perform other optimization features.

At block 380, computational lithography method 300 proceeds with simulating a lithography process using the OPCed IC design layout (e.g., including modified IC feature 160). For example, the lithography process simulation may predict a contour of an IC feature imaged on a wafer (referred to as a predicted IC contour) by exposing a mask that includes a mask pattern having the OPC contour (e.g., OPC contour 162 of IC feature 160) with given predicted lithography conditions. The lithography process simulation may be performed using various LPC models (or rules), which may be derived from actual (historic or empirical) processing data associated with IC fab 25 fabricating IC devices. The processing data may include processing conditions associated with various processes of the IC manufacturing cycle, conditions associated with tools used for manufacturing the IC, and/or other aspects of the manufacturing process. The lithography process simulation takes into account various factors, such as image contrast, depth of focus, mask error sensitivity, other suitable factors, or combinations thereof. In some examples, mask data preparation 40 can implement LPC 44 to generate the predicted IC contour at block 380.

Computational lithography method 300 then proceeds to block 385 with comparing a predicted IC contour to a target contour (or a rule-biased contour). Such a process is sometimes referred to as an OPC evaluation. For example, computational lithography method 300 evaluates a deviation between (a) points on the predicted IC contour and (b) target points (e.g., target points 152A) in order to determine whether the predicted IC contour matches the target contour (or the rule-biased contour), thereby passing the OPC evaluation. In some examples, the predicted IC contour matches the target contour (or rule-biased contour) when distances between the predicted IC contour and the target points meet a threshold distance criteria, such as a range of distances defined between the predicted IC contour and the target points that are considered acceptable. In some examples, computational lithography method 300 aims to minimize a cost function that defines a variance between the predicted contour and the target points, such as an edge placement error (EPE). If the predicted IC contour matches the target contour (or rule-biased contour), computational lithography method 300 can proceed to block 390. Otherwise, if the predicted IC contour does not match the target contour (or rule-biased contour), computational lithography method 300 returns to block 370 to perform another OPC on the OPCed IC design layout. Accordingly, block 370, block 380, and block 385 are iterative processes to generate the OPCed IC design layout. In some examples, block 370, block 380, and block 385 modify a contour of the IC feature until distances between the target points and the predicted contour fall within an acceptable distance range. Such a range may be a predetermined tolerance range.

At block 390, computational lithography method 300 provides a modified IC design layout for fabricating a mask (e.g., mask 202). The mask may be fabricated using the OPCed IC design layout, where the mask includes a mask pattern(s) that corresponds with the OPCed IC feature(s). For example, a contour of the mask pattern corresponds with the OPC contour of the IC feature (e.g., OPC contour 162 of IC feature 112). For example, the mask may be provided to mask house 20, which can implement a mask making process, described above with reference to FIG. 1, using the OPCed IC design layout to form the patterned mask layer.

Other processing steps may follow after fabricating the mask. For example, at block 395, computational lithography method 300 can proceed with performing a lithography process on a wafer (e.g., substrate 210) using a mask (mask 202) to form a final wafer feature corresponding with the IC feature (e.g., IC feature 112) in a current layer being processed (e.g., patterning stack 230). For example, IC fab 25 can implement a wafer making process, described above with reference to FIG. 1, using the mask to form a final wafer features. In some examples, a lithography system performs a lithography process to pattern a wafer material layer with a final wafer feature, where the final wafer feature corresponds with the target pattern of the IC design layout.

As discussed above, an OPC process may be rule-based or model-based, and the topography compensation techniques disclosed herein may work with either approach. In computational lithography method 300, the OPC process compensates for topographical information of an underlying layer at block 340, where a rule-based contour is generated according to a correction map. FIG. 6 is a flowchart of another computational lithography method 600, which uses a model-based OPC process. Method 600 has numerous similarities to method 300, so various embodiments of method 300 apply to method 600 where appropriate. In the interest of conciseness, only notable differences are further described.

Unlike computational lithography method 300 which at block 310 generates a correction map based on topographical information of an underlying layer, in some examples, computational lithography method 600 may not use such a correction map since the topographical information is used as mathematical terms of an OPC model. Further, after receiving an IC design layout having an IC feature (e.g., IC feature 112) at block 320 and dissecting a target contour of the IC feature into discrete segments at block 330, computational lithography method 600 proceeds differently from computational lithography method 300. Specifically, unlike computational lithography method 300 which generates a rule-based contour according to a correction map, at block 346 computational lithography method 600 generates a target placement model with terms to compensate for topographical information of the underlying layer. Therefore, in some examples, no correction map is used. Note that computational lithography method 600 may still generate a rule-based contour, but the topographical information is used differently.

In some examples, at block 346 computational lithography method 600 may identify models $F_1$ and $F_2$, which account for the topography of a photoresist layer (e.g., photoresist layer 236) and the topography of one or more underlying layers (e.g., underlying layer 220), respectively. For model $F_1$ computational lithography method 600 may identify model parameters (units) (i), where m is a number of model parameters and i is an integer from 1 to m (e.g., i=1, 2, . . . , m). For model $F_2$ computational lithography method 600 may identify model parameters (units) (j), where n is a number of model parameters and j is an integer from 1 to n (e.g., i=1, 2, . . . , n). In some examples, models and/or model parameters may be identified based on an IC design layout, an IC device to be fabricated, current layer information, underlying layer information, other suitable identification criteria, or combinations thereof. In some examples, models $F_1$ and $F_2$ are represented by:

$$F_1(x) = \sum_i c_i f_i(x) = c_1 f_1(x) + c_2 f_2(x) + \ldots + c_m f_m(x)$$

$$F_2(x) = \sum_j c_j f_j(x) = c_1 f_1(x) + c_2 f_2(x) + \ldots + c_n f_n(x)$$

where $f_k(x)$ represents a mathematical function that is designed to model a particular physical effect and $c_k$ represents a parameter associated with the mathematical function. Note that each function $f_k(x)$ and/or parameter $c_k$ may not be the same for models $F_1$ and $F_2$.

At block 356, computational lithography method 600 sets target points for a target (or rule-biased) contour according to the generated target placement model(s). Since models $F_1$ and $F_2$ are to be combined in setting the target points, $F_1$ and $F_2$ may also be considered one model that has additional terms to compensate for optical effects of the underlying layer. With models $F_1$ and $F_2$, computational lithography method 600 may perform additional steps such as model fitting and accuracy analysis of the generated models to select models that best predict locations of OPC contours. In some examples, for each model, statistical fitting techniques (or methodologies) are implemented to generate values for parameters ($c_k$). In some examples, models and corresponding parameters are designed to minimize (or eliminate) any error or difference between a predicted OPC contour (as predicted by the model) and a target OPC contour (e.g., an OPC contour expected based on historical data and/or simulated data). In some examples, the model fitting implements a least squares fitting technique, although the present disclosure contemplates any suitable model fitting technique.

FIG. 7 is a flowchart of another computational lithography method 700, which compensates for topography of an underlying layer at a later stage compared to computational lithography methods 300 and 600. Method 700 has numerous similarities to method 300, so various embodiments of method 300 apply to method 700 where appropriate. In the interest of conciseness, only notable differences are further described.

Unlike computational lithography method 300 which at block 310 compensates for topographical information of an underlying layer in a rule-biased contour, and unlike computational lithography method 600 which at block 346 compensates for such topographical information in a target placement model (which determines target points), computational lithography method 700 compensates for such topographical information in an OPC contour. Specifically, at block 347, computational lithography method 700 generates a rule-biased contour for an IC feature according to rules (but not accounting for any correction map). At block 377, computational lithography method 700 generates a modified IC feature according to a correction map (e.g., correction map 400 of FIG. 4). The modified IC feature is defined by an OPC contour. Thus, in computational lithography method 700, the topographical information of an underlying layer (and of a current layer in some examples) can be compensated for concurrently or simultaneously with the generation of an OPC contour.

By compensating for underlying layer topographical information, computational lithography methods disclosed herein (e.g., methods 300, 600, and 700) may optimize an OPC process for IC design layouts. For example, by taking into account optical reflections from an underlying layer that has uneven topography across an exposure region, the accuracy of OPC may be improved such that a final wafer feature is closer to an original IC feature designed for fabrication in an overlying layer. The complexity and cost of IC fabrication can be reduced and unwanted stack effect can be compensated within the OPC process. In some examples, if the compensation of underlying layer is sufficiently accurate, a BARC layer (e.g., BARC layer 232) may be removed, which reduces fabrication complexity, time, and cost. Note that different embodiments disclosed herein may offer different advantages, and no particular advantage is necessarily required in all embodiments.

Figure 8:
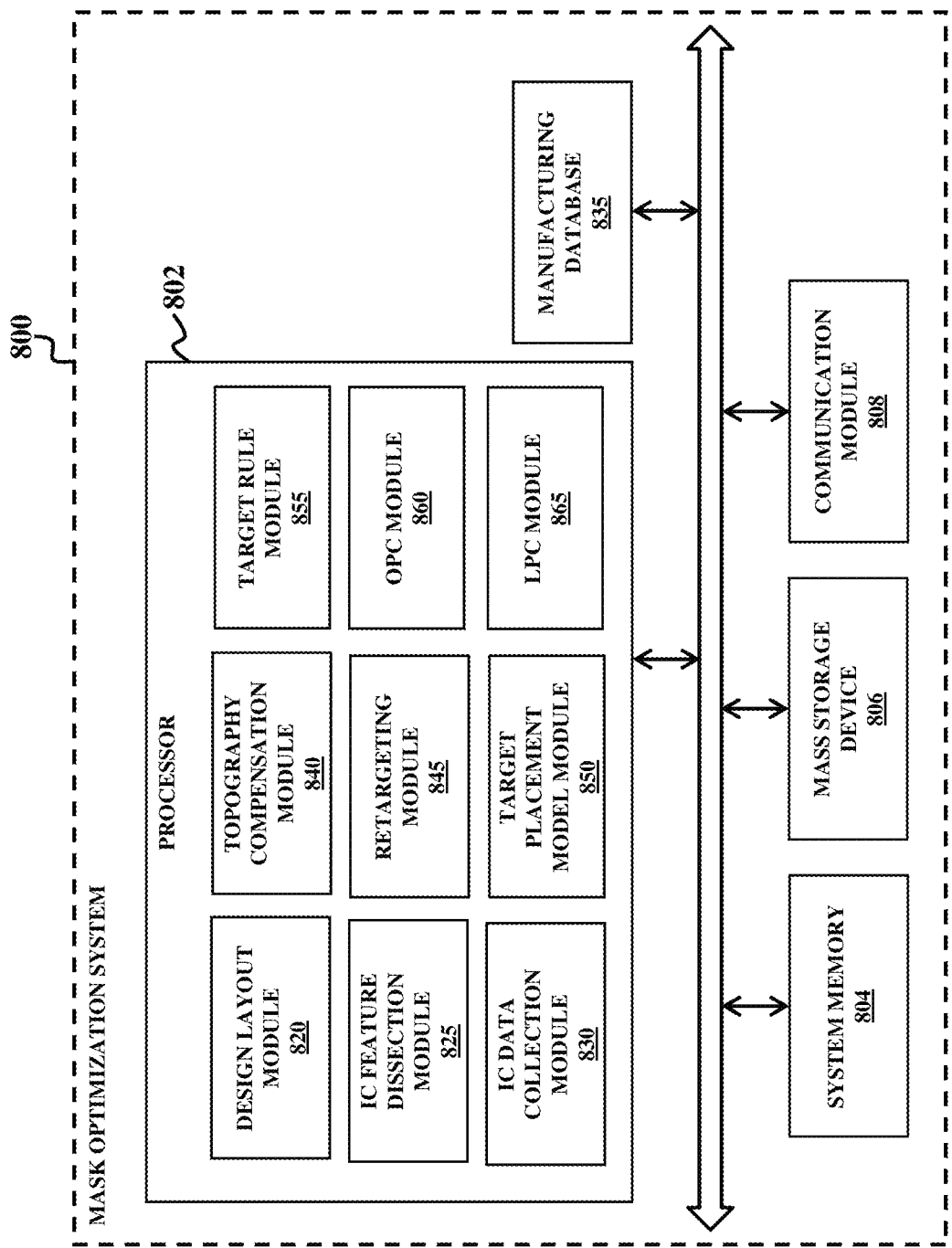
FIG. 8 is a simplified block diagram of a mask optimization system according to various embodiments of the present disclosure.

FIG. 8 is a simplified block diagram of a mask optimization system 800 according to various embodiments of the present disclosure. Mask optimization system 800 may be implemented by IC manufacturing system 10 of FIG. 1. In some examples, mask house 20 implements mask optimization system 800, where mask optimization system 800 is operable to perform functionalities described in association with mask data preparation 40 of FIG. 1. Mask optimization system 800 includes both hardware and software integrated to perform various operations and/or functions for performing computational lithography techniques, as described herein. In some examples, computational lithography methods 300, 600, and 700 may be implemented as software instructions executing on mask optimization system 800, such that mask optimization system 800 can optimize OPCed IC design layouts. FIG. 8 has been simplified for the sake of clarity to better understand the inventive concepts of the present disclosure. Additional features may be added in mask optimization system 800, and some of the features described below may be replaced or eliminated for additional embodiments of mask optimization system 800.

Mask optimization system 800 includes a processor 802 that is communicatively coupled to a system memory 804, a mass storage device 806, and a communication module 808. System memory 804 provides processor 802 with non-transitory, computer-readable storage to facilitate execution of computer instructions by processor 802. Examples of system memory 804 include random access memory (RAM) devices, such as dynamic RAM (DRAM), synchronous DRAM (SDRAM), solid state memory devices, and/or a variety of other memory devices. Computer programs, instructions, and data are stored on mass storage device 806. Examples of mass storage device 806 include hard discs, optical disks, magneto-optical discs, solid-state storage devices, and/or a variety of other mass storage devices. Communication module 808 is operable to communicate information with various components of IC manufacturing entities, such as design house 15, mask house 20, and IC fab 25 of IC manufacturing system 10. In FIG. 6, communication module 808 allows mask optimization system 800 to communicate with a mask making system (such as an e-beam lithography system) and a wafer making system (such as an optical lithography system). Communication module 808 includes Ethernet cards, 802.11 WiFi devices, cellular data radios, and/or other communication devices for facilitating communication of mask optimization system 800 with IC manufacturing entities.

Mask optimization system 800 further includes an IC design layout module 820, an IC feature dissection module 825, an IC data collection module 830, an IC manufacturing database 835, a topography compensation module 840, a retargeting module 845, a target placement model module 850, a target placement rule module 855, an OPC module 860, and an LPC module 865, which are communicatively coupled to carry out a mask optimization process (such as computational lithography methods 300, 600, and 700). In operation, IC design layout module 820 receives an IC design layout that defines a target pattern (e.g., from design house 15) and prepares the IC design layout for a mask optimization process. IC data collection module 830 is configured to collect, store, and maintain IC manufacturing data, such as data from mask making processes associated with mask house 20 and wafer making processes associated with IC fab 25. The IC manufacturing data may be stored in IC manufacturing database 835. In some examples, IC data collection module 830 analyzes the collected IC manufacturing data. In some examples, analyzing the collected IC manufacturing data can include filtering out low quality IC manufacturing data (such as data deemed not reliable) and/or consolidating the manufacturing data into useful statistical IC manufacturing information (such as averaging). In some examples, for illustration purposes only, the collected IC manufacturing data includes e-beam blur information, resist characteristic information (such as CDs associated with resist patterns after developing processes), etching bias information (such as CDs of wafer patterns after etching processes), and/or other useful IC manufacturing data. In some examples, the collected IC manufacturing data includes OPC data, such as OPC contours generated during mask optimization process.

Topography compensation module 840 is configured to determine and compensate for topographical information of an underlying layer (e.g., as described above with reference to blocks 305, 310, and 340 of computational lithography method 300, with reference to blocks 305 and 346 of computational lithography method 600, and with reference to blocks 305, 310, and 377 of computational lithography method 700). Retargeting module 845 is configured to generate rule-biased contours of the IC features of the IC design layout, such as described above with reference to block 340 of computational lithography method 300. Target placement model module 850 is configured to generate target placement models, and target placement rule module 855 is configured to generate target placement rules. Target placement model module 850 and/or target placement rule module 855 can use IC manufacturing data to generate the target placement models, such as that stored by IC manufacturing database 835. Target placement model module 850 and/or target placement rule module 855 can store the target placement models in a storage component, such as database (not shown). In some examples, target placement model module 850 performs various operations of computational lithography method 600, such as those described with reference to blocks 346 and 356, to optimize placement of target points. OPC module 860 is configured to generate an OPCed IC design layout using target points generated by target placement module 850 and/or target rule placement module 855, such as described above with reference to block 370 of computational lithography method 300. OPC module 860 is also configured to generate OPC rules and/or OPC models. OPC module 860 can use IC manufacturing data to generate the OPC rules and/or OPC models, such as that stored by IC manufacturing database 835. OPC module 860 can store the OPC rules and/or OPC models in a storage component, such as database (not shown). LPC module 865 is configured to generate predicted contours of IC features of the IC design layout based on the OPCed IC design layout, such as described above with reference to block 380 of computational lithography method 300. In some examples, mask optimization system 800 further includes a mask fracturing module (not shown) that is configured to generate a mask shot map based on a mask pattern defined by the OPCed IC design layout (which corresponds with an optimized target contour), for example, by fracturing the OPCed IC features into mask regions (mask polygons) as described herein. The mask shot map defines exposure information, such as an exposure dose, for each mask region. In alternative examples, the mask fracturing module may be eliminated, such that mask optimization system 800 generates the mask shot map for direct use by mask house 20.

Thus, the present disclosure provides examples of computational lithography methods that compensate for underlying layer topographical information. In some examples, a method includes receiving an IC design layout that includes an IC feature, where the IC feature specifies a mask feature for selectively exposing to radiation a portion of a photoresist disposed on a substrate. The method further comprises determining topographical information of an underlying layer disposed on the substrate between the photoresist and the substrate. Then, an OPC process is performed on the IC feature to generate a modified IC feature, where performing the OPC process comprises using the topographical information of the underlying layer to compensate for an amount of radiation directed towards the portion of the photoresist so as to expose the portion of the photoresist to a target dosage of radiation. As a result, the method provides a modified IC design layout including the modified IC feature for fabricating a mask based on the modified IC design layout.

In some such examples, the topographical information of the underlying layer includes: global coordinates of an area of the underlying layer that directs radiation towards photoresist; and a factor from a group consisting of: a pattern density of the area, refractive index information of the area, absorption information of the area, and thickness information of the area. In some such examples, the OPC process further compensates for a pattern density in an area of the photoresist that is in a vicinity of the portion of the photoresist and that directs radiation towards the portion of the photoresist. In some such examples, the method further comprises generating a correction map that maps radiation directed towards the photoresist by the underlying layer across the photoresist and that takes into account the topographical information of the underlying layer and the pattern density in the area of the photoresist. The correction map is used in the OPC process in generating the modified IC feature. In some such examples, performing the OPC process further comprises dissecting the IC feature to generate feature segments; generating a rule-biased contour of the IC feature based on the feature segments; setting target points for the IC feature along the rule-biased contour; and generating an OPC contour for the modified IC feature based on the target points. In some such examples, the rule-biased contour is generated according to a correction map that accounts for the topographical information of the underlying layer. In some such examples, the OPC contour is generated according to a correction map that accounts for the topographical information of the underlying layer. In some such examples, performing the OPC process further comprises: setting target points for the IC feature by using the topographical information of the underlying layer to compensate for the amount of radiation directed towards the portion of the photoresist; and generating an OPC contour that defines a perimeter of the modified IC feature using the target points.

In further examples, a method comprises receiving an IC design layout that includes an IC feature, where the IC feature configured to be fabricated in a selected portion of a photoresist layer disposed on a substrate. A rule-biased contour for the IC feature is generated according to a correction map that compensates for optical reflections from an underlying layer disposed on the substrate between the photoresist layer and the substrate. Target points for the IC feature are computed along the rule-biased contour. A modified IC feature is generated based on the target points, with the modified IC feature having an OPC contour. The method provides a modified IC design layout including the modified IC feature for fabricating a mask based on the modified IC design layout.

In some such examples, the method further comprises generating the correction map before generating the rule-biased contour of the IC feature. The generation of the correction map comprises using the following factors to compensate for the optical reflections from the underlying layer: global coordinates of an area in the underlying layer that directs radiation towards the selected portion of the photoresist layer; and a pattern density of the area in the underlying layer. In some such examples, the generation of the correction map further comprises using the following information to compensate for the optical reflections from the underlying layer: refractive index information of the area in the underlying layer; absorption information of the area in the underlying layer; and thickness information of the area in the underlying layer. In some such examples, the optical reflections from the underlying layer are represented in the correction map as CD compensation values. In some such examples, the IC feature is a first IC feature, the rule-biased contour is a first rule-biased contour, and the area in the underlying layer is a first area with a first pattern density. The IC design layout further includes a second IC feature that is substantially similar to the first IC feature. Here, the method further comprises generating a second rule-biased contour of the second IC feature according to the correction map that further compensates for optical reflections from a second area in the underlying layer. The second rule-biased contour is different from the first rule-biased contour based on a second pattern density of the second area that is different from the first pattern density. In some such examples, the method further comprises dissecting the IC feature to generate pattern segments before generating the rule-biased contour of the IC feature based on the pattern segments. The target points for the IC feature are computed based on a target placement rule. In some such examples, the underlying layer is a first underlying layer, the photoresist layer sits above a second underlying layer, and the correction map further compensates for optical reflections from the second underlying layer. In some such examples, the method further comprises performing a lithography process on the substrate using the mask to form a final wafer feature corresponding with the IC feature in the photoresist layer. The photoresist layer is separated from the underlying layer by at least a middle layer situated therebetween, and the correction map does not compensate for optical reflections from the middle layer. In some such examples, the photoresist layer is further separated from the underlying layer by a BARC layer situated below the middle layer and above the underlying layer, and the correction map does not compensate for optical reflections from the BARC layer. In some such examples, the method further comprises simulating the lithography process before providing the modified IC design layout for fabricating the mask. Simulating the lithography process includes using an iterative computation process to reduce a difference between the target points and corresponding points on the OPC contour until the difference falls within a predetermined tolerance range.

In further examples, an IC system comprises a processor and a communication module communicatively coupled to the processor and configured to receive an IC design layout that includes an IC feature. The IC feature is to be fabricated in a portion of a first layer disposed on a substrate. The IC system further comprises a non-transitory, computer-readable storage communicatively coupled to the processor and including instructions executable by the processor. The instructions include: instructions for determining topographical information of a second layer disposed on the substrate between the first layer and the substrate; and instructions for performing an OPC process on the IC feature to generate a modified IC feature with an OPC contour. The generation of the modified IC feature compensates for the topographical information of the second layer. In some such examples, the topographical information of the second layer includes the following factors: global coordinates of an area in the second layer that reflects radiation toward the portion of the first layer; a pattern density of the area in the second layer; refractive index information of the area in the second layer; absorption information of the area in the second layer; and thickness information of the area in the second layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for integrated circuit (IC) fabrication, the method comprising:
   receiving an IC design layout that includes an IC feature, the IC feature specifying a mask feature for selectively exposing to radiation a portion of a photoresist disposed on a substrate;
   determining topographical information of an underlying layer disposed on the substrate between the photoresist and the substrate, wherein the topographical information comprises global coordinates of an area of the underlying layer that directs radiation towards photoresist, and refractive index information of the area;
   performing an optical proximity correction (OPC) process on the IC feature to generate a modified IC feature, wherein performing the OPC process comprises using the topographical information of the underlying layer to compensate for an amount of radiation directed towards the portion of the photoresist so as to expose the portion of the photoresist to a target dosage of radiation; and
   providing a modified IC design layout including the modified IC feature for fabricating a mask based on the modified IC design layout.

2. The method of claim 1, wherein the topographical information of the underlying layer includes:
   a pattern density of the area, and
   thickness information of the area.

3. The method of claim 1, wherein the OPC process further compensates for a pattern density in an area of the photoresist that is in a vicinity of the portion of the photoresist and that directs radiation towards the portion of the photoresist.

4. The method of claim 3, further comprising generating a correction map that maps radiation directed towards the photoresist by the underlying layer across the photoresist and that takes into account the topographical information of the underlying layer and the pattern density in the area of the photoresist, wherein the correction map is used in the OPC process in generating the modified IC feature.

5. The method of claim 1, wherein performing the OPC process further comprises:
   dissecting the IC feature to generate feature segments;
   generating a rule-biased contour of the IC feature based on the feature segments;
   setting target points for the IC feature along the rule-biased contour; and
   generating an OPC contour for the modified IC feature based on the target points.

6. The method of claim 5, wherein the rule-biased contour is generated according to a correction map that accounts for the topographical information of the underlying layer.

7. The method of claim 5, wherein the OPC contour is generated according to a correction map that accounts for the topographical information of the underlying layer.

8. The method of claim 1, wherein performing the OPC process further comprises:
   setting target points for the IC feature, wherein setting the target points comprises using the topographical information of the underlying layer to compensate for the amount of radiation directed towards the portion of the photoresist; and
   generating an OPC contour that defines a perimeter of the modified IC feature using the target points.

9. A method comprising:
   receiving an integrated circuit (IC) design layout that includes an IC feature, the IC feature configured to be fabricated in a selected portion of a photoresist layer disposed on a substrate;
   generating a rule-biased contour for the IC feature according to a correction map that compensates for optical reflections from an underlying layer disposed on the substrate between the photoresist layer and the substrate;
   computing target points for the IC feature along the rule-biased contour;
   generating a modified IC feature based on the target points, the modified IC feature having an optical proximity correction (OPC) contour; and
   providing a modified IC design layout including the modified IC feature for fabricating a mask based on the modified IC design layout.

10. The method of claim 9, further comprising generating the correction map before generating the rule-biased contour of the IC feature, wherein the generation of the correction map comprises using the following factors to compensate for the optical reflections from the underlying layer:
    global coordinates of an area in the underlying layer that directs radiation towards the selected portion of the photoresist layer; and
    a pattern density of the area in the underlying layer.

11. The method of claim 10, wherein the generation of the correction map further comprises using the following information to compensate for the optical reflections from the underlying layer:
    refractive index information of the area in the underlying layer;
    absorption information of the area in the underlying layer; and
    thickness information of the area in the underlying layer.

12. The method of claim 11, wherein the optical reflections from the underlying layer are represented in the correction map as critical dimension (CD) compensation values.

13. The method of claim 10, wherein the IC feature is a first IC feature, the rule-biased contour is a first rule-biased contour, and the area in the underlying layer is a first area with a first pattern density, wherein the IC design layout further includes a second IC feature that is substantially similar to the first IC feature, the method further comprising generating a second rule-biased contour of the second IC feature according to the correction map that further compensates for optical reflections from a second area in the underlying layer, wherein the second rule-biased contour is different from the first rule-biased contour based on a second pattern density of the second area that is different from the first pattern density.

14. The method of claim 9, further comprising dissecting the IC feature to generate pattern segments before generating the rule-biased contour of the IC feature based on the pattern segments, wherein the target points for the IC feature are computed based on a target placement rule.

15. The method of claim 9, wherein the underlying layer is a first underlying layer, wherein the photoresist layer sits above a second underlying layer, wherein the correction map further compensates for optical reflections from the second underlying layer.

16. The method of claim 9, further comprising performing a lithography process on the substrate using the mask to form a final wafer feature corresponding with the IC feature in the photoresist layer, wherein the photoresist layer is separated from the underlying layer by at least a middle layer situated therebetween, and wherein the correction map does not compensate for optical reflections from the middle layer.

17. The method of claim 16, wherein the photoresist layer is further separated from the underlying layer by a bottom anti-reflective coating (BARC) layer situated below the middle layer and above the underlying layer, and wherein the correction map does not compensate for optical reflections from the BARC layer.

18. The method of claim 16, further comprising simulating the lithography process before providing the modified IC design layout for fabricating the mask, wherein simulating the lithography process includes using an iterative computation process to reduce a difference between the target points and corresponding points on the OPC contour until the difference falls within a predetermined tolerance range.

19. An integrated circuit (IC) system, comprising:
 a processor;
 a communication module communicatively coupled to the processor and configured to receive an IC design layout that includes an IC feature, wherein the IC feature is to be fabricated in a portion of a first layer disposed on a substrate; and
 a non-transitory, computer-readable storage communicatively coupled to the processor and including instructions executable by the processor, the instructions including:
  instructions for determining topographical information of a second layer disposed on the substrate between the first layer and the substrate, wherein the topographical information of the second layer comprises global coordinates of an area in the second layer that reflects radiation toward the portion of the first layer and a pattern density of the area in the second layer; and
  instructions for performing an optical proximity correction (OPC) process on the IC feature to generate a modified IC feature with an OPC contour, wherein the generation of the modified IC feature compensates for the topographical information of the second layer.

20. The IC system of claim 19, wherein the topographical information of the second layer further comprises:
 refractive index information of the area in the second layer;
 absorption information of the area in the second layer; and
 thickness information of the area in the second layer.

* * * * *